US010261110B2

(12) United States Patent
Shimizu et al.

(10) Patent No.: US 10,261,110 B2
(45) Date of Patent: Apr. 16, 2019

(54) PROBE GUIDE PLATE HAVING A SILICON OXIDE LAYER FORMED ON SURFACES AND ON AN INNER WALL OF A THROUGH HOLE THEREOF, AND A PROTECTIVE INSULATING LAYER FORMED ON THE SILICON OXIDE LAYER, AND PROBE APPARATUS INCLUDING THE PROBE GUIDE PLATE

(71) Applicants: SHINKO ELECTRIC INDUSTRIES CO., LTD., Nagano-shi, Nagano (JP); JAPAN ELECTRONIC MATERIALS CORPORATION, Amagasaki-shi, Hyogo (JP)

(72) Inventors: Yuichiro Shimizu, Nagano (JP); Kosuke Fujihara, Nagano (JP); Tomoo Yamasaki, Nagano (JP); Chikaomi Mori, Amagasaki (JP)

(73) Assignees: SHINKO ELECTRIC INDUSTRIES CO., LTD., Nagano-Shi (JP); JAPAN ELECTRONIC MATERIALS CORPORATION, Amagasaki-Shi (JP)

( * ) Notice: Subject to any disclaimer, the term of this patent is extended or adjusted under 35 U.S.C. 154(b) by 201 days.

(21) Appl. No.: 15/356,868

(22) Filed: Nov. 21, 2016

(65) Prior Publication Data
US 2017/0146569 A1 May 25, 2017

(30) Foreign Application Priority Data
Nov. 25, 2015 (JP) .................................. 2015-229681

(51) Int. Cl.
*G01R 31/20* (2006.01)
*G01R 1/073* (2006.01)
*G01R 31/26* (2014.01)

(52) U.S. Cl.
CPC ..... *G01R 1/07371* (2013.01); *G01R 31/2601* (2013.01)

(58) Field of Classification Search
CPC .. G01R 31/275; G01R 31/28; G01R 31/2853; G01R 31/2886; G01R 1/07371;
(Continued)

(56) References Cited

U.S. PATENT DOCUMENTS 8,048,694 B2 * 11/2011 Wen ........................ H01L 33/62
257/98
9,829,509 B2 * 11/2017 Shimizu ............. G01R 1/07371
(Continued)

FOREIGN PATENT DOCUMENTS

JP 2014-232030 12/2014

*Primary Examiner* — Vinh P Nguyen
(74) *Attorney, Agent, or Firm* — Rankin, Hill & Clark LLP

(57) ABSTRACT

A probe guide plate includes: a silicon substrate including one surface and the other surface opposite to the one surface; a through hole formed through the silicon substrate to extend from the one surface of the silicon substrate to the other surface of the silicon substrate; a silicon oxide layer formed on the one surface of the silicon substrate, the other surface of the silicon substrate, and an inner wall surface of the through hole; and a protective insulating layer formed on the silicon oxide layer. The protective insulating layer is formed on at least one of the one surface and the other surface of the silicon substrate via the silicon oxide layer, and partially formed on the inner wall surface of the through hole via the silicon oxide layer.

9 Claims, 8 Drawing Sheets

(58) Field of Classification Search
CPC .. G01R 3/00; G01R 1/07342; G01R 1/07357;
H01R 12/515; H01R 12/7011; H01R
12/718; H01R 13/02; H01R 23/7042;
H01R 3/08; H01R 4/023; H01R 4/58;
H01L 2924/00; H01L 2224/48227; H01L
21/265; H01L 21/67109; H01L 21/67196;
H01L 2224/73201; H01L 21/76898;
H01L 2224/83; H01L 22/12
See application file for complete search history.

(56) References Cited

U.S. PATENT DOCUMENTS

| | | | |
|---|---|---|---|
| 2007/0020914 A1* | 1/2007 | Higashi | H01L 21/486 438/618 |
| 2012/0104445 A1* | 5/2012 | Yang | H01L 33/60 257/98 |
| 2014/0354315 A1 | 12/2014 | Shimizu et al. | |
| 2017/0205444 A1* | 7/2017 | Fujihara | G01R 1/07371 |

* cited by examiner (PLAN VIEW)

|  | ZIRCONIA LAYER | ALUMINUM LAYER | SILICON OXIDE LAYER |
|---|---|---|---|
| VICKERS HARDNESS (GPa) | 13 | 15 | 10 |
| BENDING STRENGTH (Mpa) | 1000 | 300 | 180 |

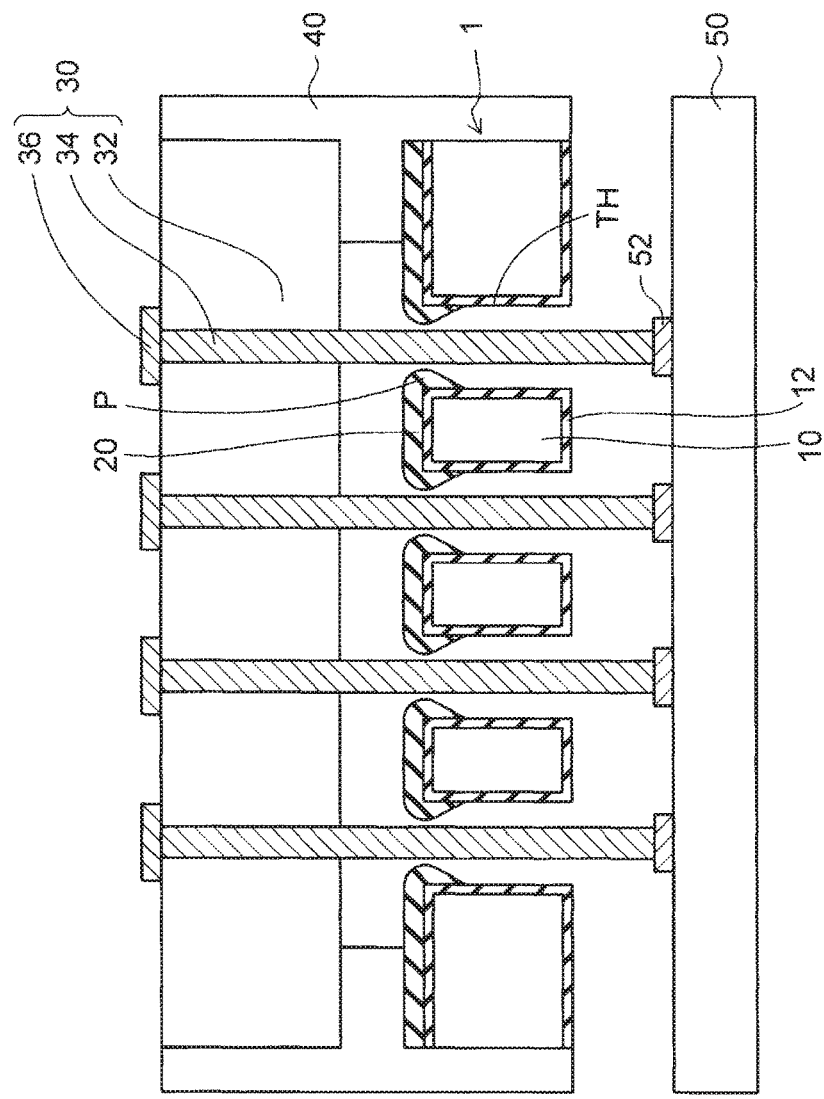

PROBE GUIDE PLATE HAVING A SILICON OXIDE LAYER FORMED ON SURFACES AND ON AN INNER WALL OF A THROUGH HOLE THEREOF, AND A PROTECTIVE INSULATING LAYER FORMED ON THE SILICON OXIDE LAYER, AND PROBE APPARATUS INCLUDING THE PROBE GUIDE PLATE

This application claims priority from Japanese Patent Application No. 2015-229681, filed on Nov. 25, 2015, the entire contents of which are herein incorporated by reference.

BACKGROUND

1. Technical Field

The present disclosure relates to a probe guide plate and a probe apparatus including the probe guide plate.

2. Description of the Related Art

Electric properties of a subject such as a semiconductor device can be measured by a probe apparatus whose probe terminals are brought into contact with a large number of electrode pads of the subject to conduct electricity thereto. The probe apparatus includes a probe guide plate provided with through holes. The probe terminals are inserted into the through holes of the probe guide plate. Thus, the probe terminals are positioned (see e.g., JP-A-2014-232030).

As will be described later in a preliminary matter, a silicon oxide layer which is thin in film thickness is formed on inner wall surfaces of through holes of a silicon substrate in a probe guide plate of a probe apparatus. Electric properties of a subject are measured in a state in which probe terminals are inserted into the through holes of the probe guide plate. When measurement of electric properties of a predetermined amount of such subjects is repeatedly performed, the silicon oxide layer on the inner wall surfaces of the through holes is apt to be worn and lost by the probe terminals. For this reason, there has been a request for a further improvement in durability of the probe guide plate.

SUMMARY

According to one or more aspects of the present disclosure, there is provided a probe guide plate. The probe guide plate comprises:

a silicon substrate comprising one surface and the other surface opposite to the one surface;

a through hole formed through the silicon substrate to extend from the one surface of the silicon substrate to the other surface of the silicon substrate;

a silicon oxide layer formed on the one surface of the silicon substrate, the other surface of the silicon substrate, and an inner wall surface of the through hole; and a protective insulating layer formed on the silicon oxide layer.

The protective insulating layer is formed on at least one of the one surface and the other surface of the silicon substrate via the silicon oxide layer, and partially formed on the inner wall surface of the through hole via the silicon oxide layer.

The protective insulating layer formed on at least one of the one surface and the other surface of the silicon substrate via the silicon oxide layer is integrally formed with the protective insulating layer partially formed on the inner wall surface of the through hole via the silicon oxide layer.

BRIEF DESCRIPTION OF THE DRAWINGS

FIG. 11 is a sectional view showing a probe apparatus provided with the probe guide plate shown in FIG. 5A.

DETAILED DESCRIPTION

An embodiment will be described below with reference to the accompanying drawings.

A preliminary matter underlying the embodiment will be described prior to description of the embodiment. Description of the preliminary matter is about the details of personal study of the present inventor, which contain novel techniques rather than known techniques.

Figure 1A:
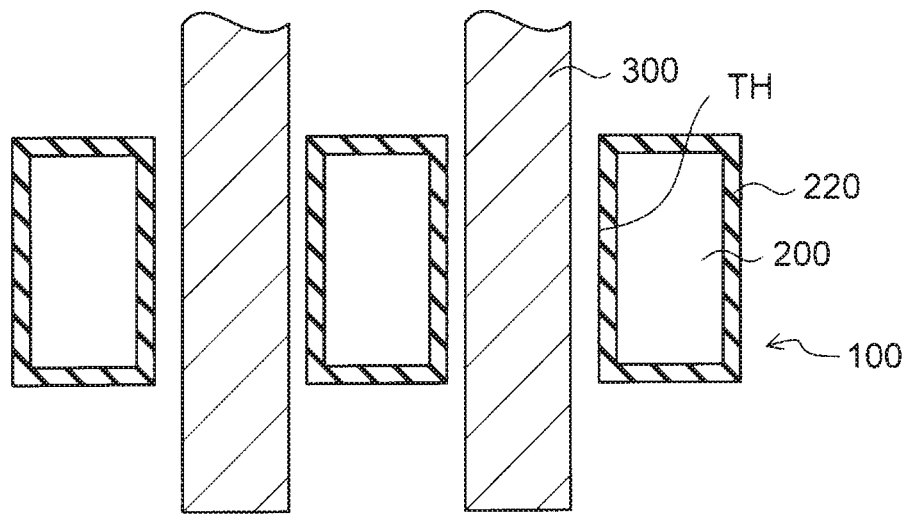
FIGS. 1A and 1B are sectional views for explaining a problem of a probe guide plate according to a preliminary matter.

A probe guide plate 100 provided in a probe apparatus according to the preliminary matter is shown in FIG. 1A. The probe guide plate 100 has a silicon substrate 200 in which through holes TH are formed. In addition, a silicon oxide layer 220 is formed on opposite surfaces of the silicon substrate 200 and inner wall surfaces of the through holes TH.

Probe terminals 300 of the probe apparatus are inserted into the through holes TH of the silicon substrate 200. The probe terminals 300 are positioned by the through holes TH. Front ends of the probe terminals 300 are disposed on electrode pads of a subject with high position accuracy.

When electric properties of the subject are measured, the probe terminals 300 contact the silicon oxide layer 220 on the inner wall surfaces of the through holes TH. For this reason, the silicon oxide layer 220 is scratched by the probe terminals 300.

Therefore, when measurement of electric characteristics of a predetermined amount of such subjects is repeatedly performed, the silicon oxide layer 220 on the inner wall surfaces of the through holes TH of the silicon substrate 200 may be won and lost. When the silicon oxide layer 220 which is an insulating layer is lost, the silicon substrate 200 is exposed to thereby generate electric short-circuiting between the probe terminals 300. For this reason, accurate electric measurement cannot be made.

The silicon substrate 200 is thermally oxidized to form the silicon oxide layer 220. Accordingly, the silicon oxide layer 220 is formed as a thin film about 5 μm thick. For this reason, there has been a request for a further improvement in durability of the probe guide plate 100 because the silicon oxide layer 220 is worn and lost.

Figure 1B:
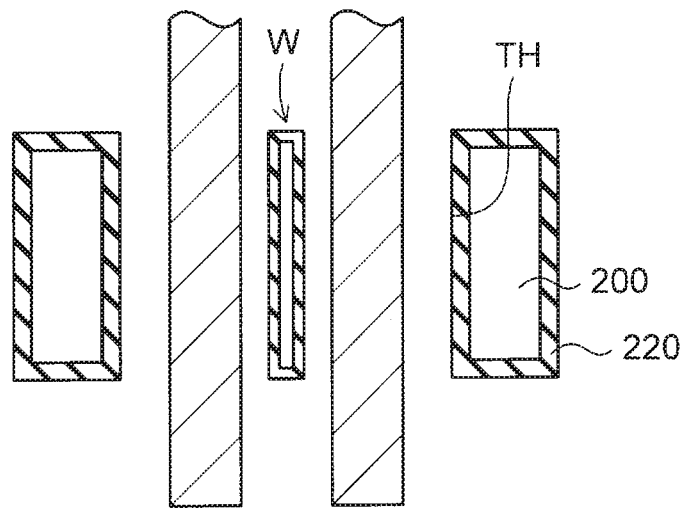

When a pitch for disposing the through holes TH of the silicon substrate 200 is shortened, as shown in FIG. 1B, the thickness of a wall part W disposed between the probe terminals 300 is reduced. Accordingly, there is a fear that mechanical strength may not be obtained satisfactorily.

The aforementioned problem can be solved by a probe guide plate according to an embodiment which will be described below.

Embodiment

FIGS. 2A and 2B, FIGS. 3A and 3B, and FIGS. 4A and 4B are views for explaining a method for manufacturing the probe guide plate according to the embodiment. FIGS. 5A and 5B are views showing the probe guide plate according to the embodiment. FIG. 11 is a view showing a probe apparatus according to the embodiment. While the method for manufacturing the probe guide plate is described, the structure of the probe guide plate and the structure of the probe apparatus will be described below.

Figure 2A:
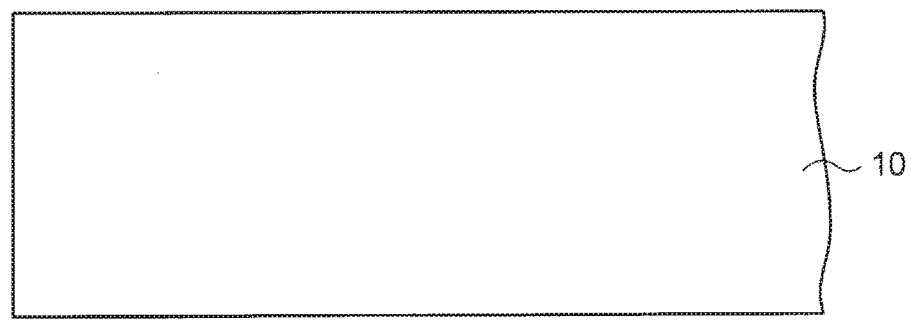
FIGS. 2A and 2B are sectional views (part 1) showing a method for manufacturing a probe guide plate according to an embodiment.

In the method for manufacturing the probe guide plate according to the embodiment, first, a silicon substrate 10 is prepared, as shown in FIG. 2A. A silicon wafer which is 600 μm to 800 μm thick is used as the silicon substrate 10.

Figure 2B:
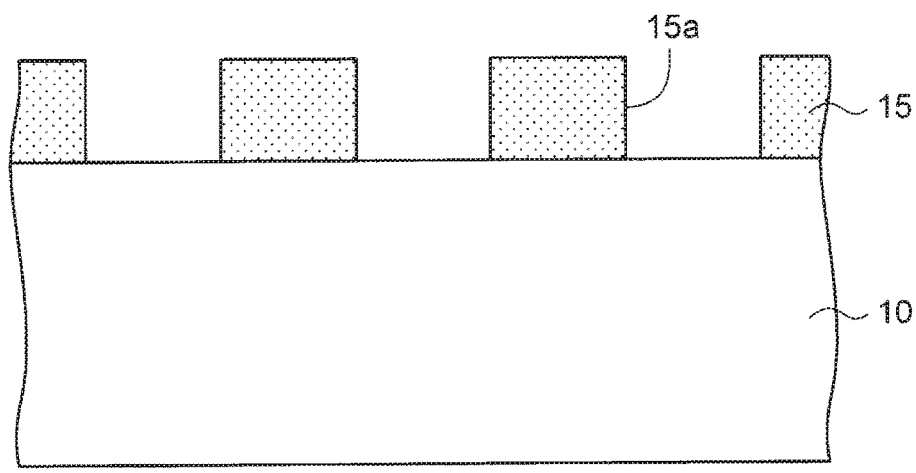

Next, a resist layer 15 provided with opening portions 15a is patterned and formed on the silicon substrate 10, as shown in FIG. 2B.

A liquid resist is applied, exposed to light and developed photolithographically to form the resist layer 15. Alternatively, a dry film resist may be used to form the resist layer 15.

Figure 3A:
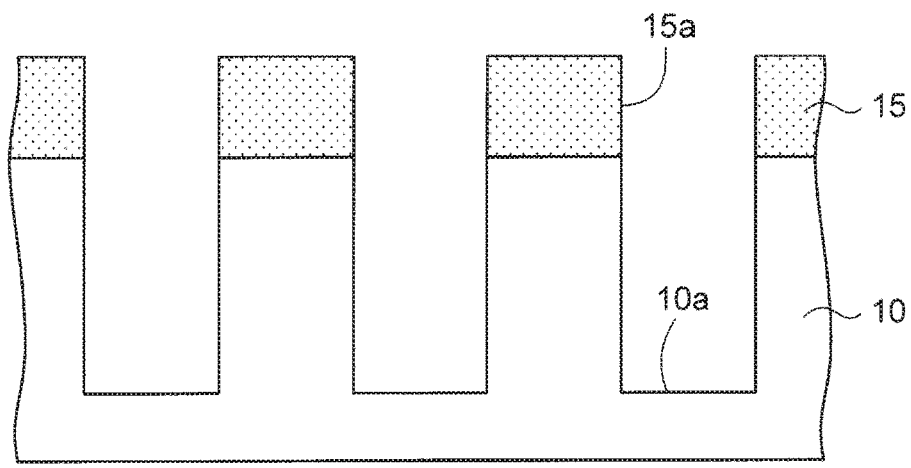
FIGS. 3A and 3B are sectional views (part 2) showing the method for manufacturing the probe guide plate according to the embodiment.

Successively, as shown in FIG. 3A, the silicon substrate 10 is etched halfway in a thickness direction through the opening portions 15a of the resist layer 15 by anisotropic dry etching. Thus, recess portions 10a are formed. DRIE (Deep Reactive Ion Etching) etc. using $SF_6$-based gas can be used for the anisotropic dry etching.

Figure 3B:
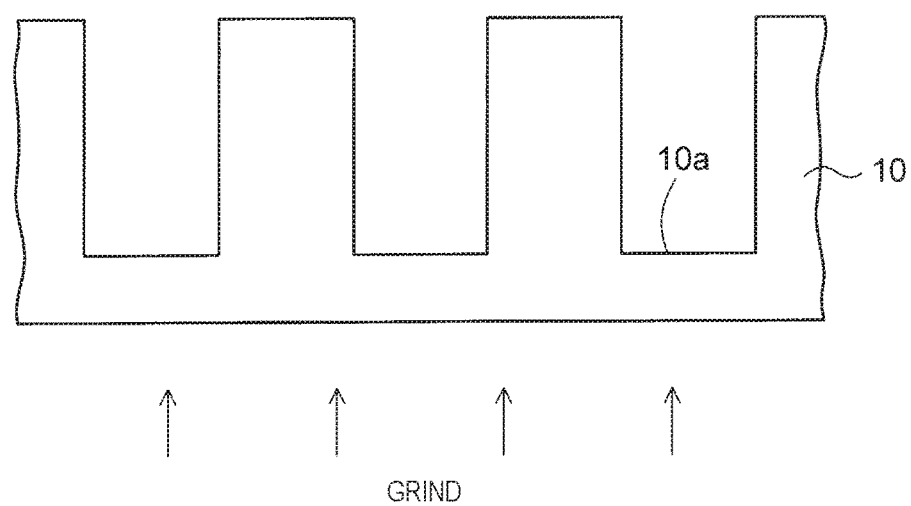

Then, the resist layer 15 is removed, as shown in FIG. 3B. Further, a lower surface of the silicon substrate 10 is ground by a back grinder apparatus to reach the bottom of the recess portions 10a.

Figure 4A:
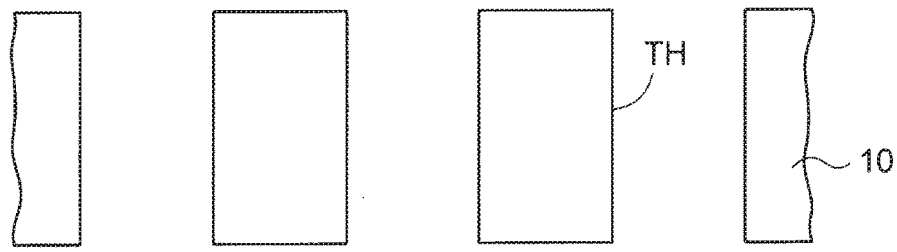
FIGS. 4A and 4B are sectional views (part 3) showing the method for manufacturing the probe guide plate according to the embodiment.
Figure 5A:
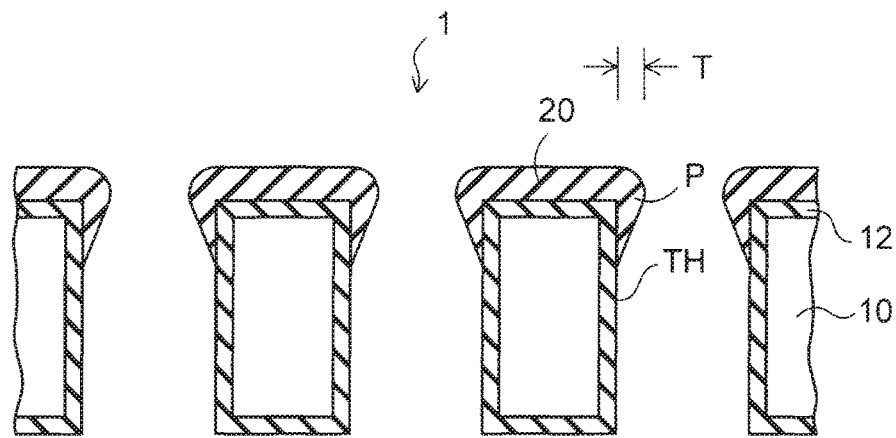
FIGS. 5A and 5B are sectional views showing the probe guide plate according to the embodiment.
Figure 5B:
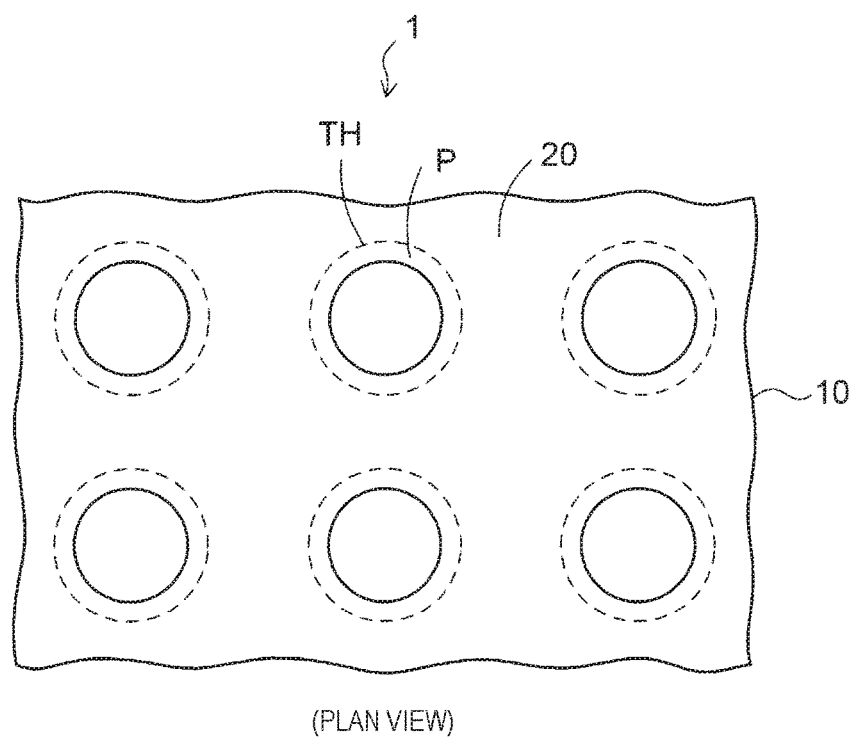

Thus, the recess portions 10a of the silicon substrate 10 become through holes TH penetrating the silicon substrate 10 in the thickness direction, as shown in FIG. 4A.

In this manner, the silicon substrate 10 is thinned to a predetermined thickness, and the through holes TH are formed in the silicon substrate 10.

Another method may be used as follows. That is, the silicon substrate 10 in FIG. 2A is ground and thinned to the predetermined thickness. Then, the silicon substrate 10 is perforated by anisotropic dry etching so that the through holes TH are formed in the silicon substrate 10.

In the aforementioned manner, the through holes TH are formed to penetrate the silicon substrate 10 in the thickness direction.

Figure 4B:
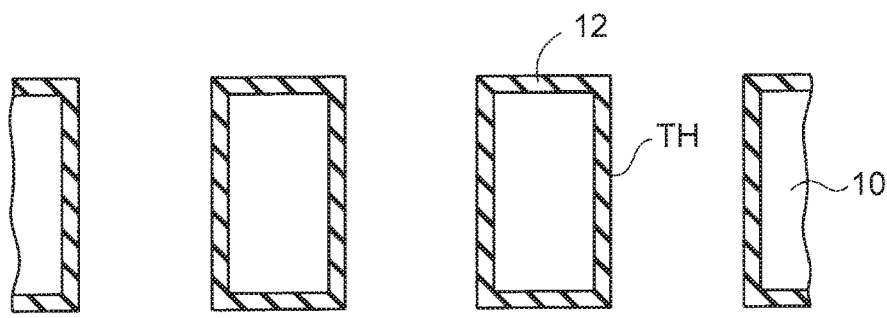

Next, when the silicon substrate 10 is thermally oxidized, a silicon oxide layer 12 is formed on upper and lower surfaces of the silicon substrate 10 and inner wall surfaces of the through holes TH, as shown in FIG. 4B. Alternatively, a silicon oxide layer 12 or a silicon nitride layer etc. may be formed by a CVD (Chemical Vapor Deposition) method.

Successively, a protective insulating layer 20 is formed on the silicon oxide layer 12 on the silicon substrate 10 by a sputtering method, as shown in FIG. 5A.

A zirconia ($ZrO_2$) layer, an alumina ($Al_2O_3$) layer, or a silicon oxide ($SiO_2$) layer etc. is provided as the protective insulating layer 20 formed by the sputtering method.

Figures 6, 7:
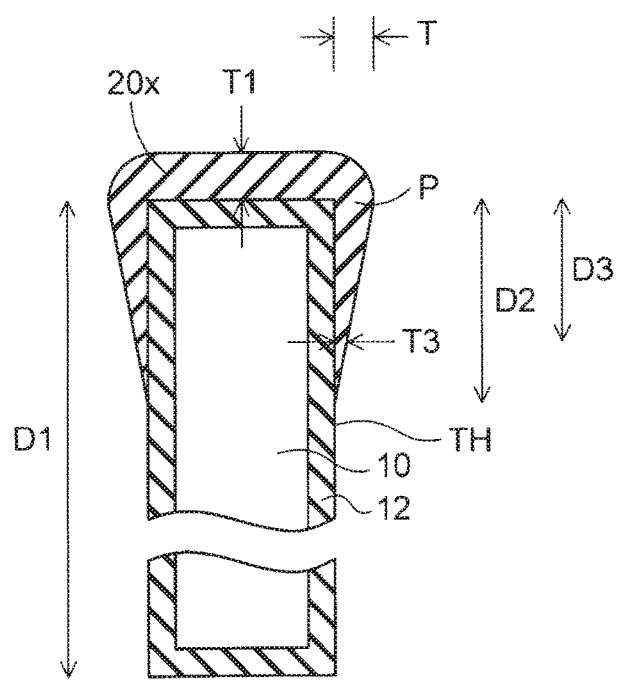
FIG. 6 is a table showing physical properties of protective insulating layers which can be used in the probe guide plate according to the embodiment.
FIG. 7 is a sectional view showing an example of a sectional shape of a protective insulating player of the probe guide plate according to the embodiment.

Physical properties about Vickers Hardnesses and bending strengths of the zirconia layer, the alumina layer and the silicon oxide layer are shown in FIG. 6. Each of the zirconia layer, the alumina layer and the silicon oxide layer has Vickers hardness whose value is not lower than 10 GPa. Thus, each of the zirconia layer, the alumina layer and the silicon oxide layer has high hardness.

In addition, since the zirconia layer has bending strength of 1,000 MPa and also has high fracture toughness, it has an effect to absorb a load.

As described above, particularly, the zirconia layer is high in Vickers hardness, bending strength and fracture toughness. Accordingly, the zirconia layer can be preferably used as the protective insulating layer 20.

Yttria-stabilized zirconia obtained by adding yttria ($Y_2O_3$ (yttrium oxide)) to zirconia is preferably used as the material of the zirconia layer. When yttria is added to zirconia, mechanical properties such as hardness, bending strength, etc. can be further improved. In addition, yttria-stabilized zirconia is also excellent in heat resistance. Therefore, yttria-stabilized zirconia is preferred as the material of the protective insulating layer 20.

Each of the alumina layer and the silicon oxide layer has considerably lower bending strength than the zirconia layer but has sufficient Vickers hardness. Therefore, the alumina layer and the silicon oxide layer can be satisfactorily used as the protective insulating layer 20.

An insulating material having Vickers hardness not lower than about 10 GPa is preferable as the material of the protective insulating layer 20. However, any other insulating material may be used alternatively.

As shown in FIG. 5A, the protective insulating layer 20 which is formed by the sputtering method is partially formed via the silicon oxide layer 12 in a range of from the upper surface of the silicon substrate 10 to upper portion sides of the inner wall surfaces of the through holes TH. In addition, the protective insulating layer 20 which is formed on the upper portion side of the inner wall surface of each through hole TH is formed with a thickness which is gradually reduced from the upper side toward a lower side position.

In this manner, portions of the protective insulating layer 20 which are disposed on the upper portions of the inner wall surfaces of the through holes TH of the silicon substrate 10 are formed as protrusive portions P protruding outward inside the through holes TH. Since the silicon oxide layer 12 on the upper portions of the inner wall surfaces of the through holes TH is protected by the protrusive portions P of the protective insulating layer 20, the silicon oxide layer 12 can be suppressed from being worn by the probe terminals.

For example, the thickness of the silicon oxide layer 12 is set in a range of 0.5 μm to 5 μm. The thickness T of each protrusive portion P of the protective insulating layer 20 is likewise set in a range of 0.5 μm to 5 μm. The thickness T of the protrusive portion P of the protective insulating layer 20 is adjusted in consideration of the thickness of the silicon oxide layer 12, in order to improve the life of the probe guide plate 1.

Film formation conditions in the case where a zirconia layer 20x is formed as the protective insulating layer 20 by the sputter method will be shown by way of example as follows.

Target: yttria-stabilized zirconia (YSZ) (yttria addition rate: 3 mol %)
Gas: argon (Ar)
Gas Pressure: 0.5 Pa (preferable range: 0.1 Pa to 1.0 Pa)
Output: RF power 200 W A sectional shape of the zirconia layer 20x which is formed as a film in the aforementioned sputtering conditions is shown in FIG. 7. In the example of FIG. 7, a depth D1 of each through hole TH is about 200 μm, and a thickness TI of the protective insulating layer 20 on the upper surface side of the silicon substrate 10 is about 1 μm. The zirconia layer 20x is formed up to a position of the inner wall surface at a depth D2 of about 40 μm from an upper end of the through hole TH.

In this case, a thickness T of each protrusive portion P of the zirconia layer 20x is about 0.8 μm. In addition, a thickness T3 of the protective insulating layer 20 at a position of the inner wall surface at a depth D3 of about 30 μm from the upper end of the through hole TH is about 0.3 μm.

In addition, in the inner wall surface of the through hole TH, a region deeper than the depth D2 (40 μm) from the upper end is a non-formation region where the zirconia layer 20x is not formed.

The length of the zirconia layer 20x extending in the depth direction from the upper end of the inner wall surface of the through hole TH can be adjusted depending on the film thickness formed by sputtering or the sputtering conditions. In addition, the thickness T of the protrusive portion P of the zirconia layer 20x can be adjusted depending on the film thickness formed by sputtering and the sputtering conditions.

Although an example in which the zirconia layer 20x is formed as the protective insulating layer 20 by the sputtering method has been shown, any other insulating layer such as the alumina layer or the silicon oxide layer etc. can be also formed into a similar shape by using the sputtering method.

As described above, the protective insulating layer 20 is partially formed in a range of from the upper surface side of the silicon substrate 10 to the upper portion side of the inner wall surface of each through hole TH in the embodiment. This means that the protective insulating layer 20 may be formed in a range of from the upper surface side of the silicon substrate 10 to a midway position of the inner wall surface of the through hole TH in the depth direction.

Then, the silicon substrate 10 is cut so that individual product regions can be obtained. In the aforementioned manner, the probe guide plate 1 according to the embodiment can be manufactured.

As shown in FIG. 5A, the probe guide plate 1 according to the embodiment is provided with the silicon substrate 10. The through holes TH are formed to penetrate the silicon substrate 10 in the thickness direction. In addition, the silicon oxide layer 12 is formed as an insulating layer on the opposite surfaces of the silicon substrate 10 and the inner wall surfaces of the through holes TH.

The protective insulating layer 20 is formed on the silicon oxide layer 12 on the upper surface of the silicon substrate 10. The protective insulating layer 20 is partially formed via the silicon oxide layer 12 in a range of from the upper surface of the silicon substrate 10 to the upper portion sides of the inner wall surfaces of the through holes TH.

Portions of the protective insulating layer 20 disposed on the upper portions of the inner wall surfaces of the through holes TH are formed as the protrusive portions P protruding outward inside the through holes TH.

The length of the protective insulating layer 20 extending from the upper surface of the silicon substrate 10 to the inner wall surface of each through holes TH can be set desirably. Accordingly, the protective insulating layer 20 is formed up to any midway position of the inner wall surface of the through hole TH in the depth direction.

In addition, the protective insulating layer 20 is formed with a thickness which is gradually reduced from the upper side of the inner wall surface of the through hole TH toward a lower side position of the same. A lower portion side region of the inner wall surface of the through hole TH is a non-formation region where the protective insulating layer 20 is not formed.

FIG. 5B is a plan view when the probe guide plate 1 in FIG. 5A is seen from a plane. As shown in the plan view of FIG. 5B, each through hole TH of the silicon substrate 10 is formed into a circular shape, and each protrusive portion P of the protective insulating layer 20 is disposed annularly on the upper portion of the inner wall surface of the through hole TH. The planar shape of the through hole TH of the silicon substrate 10 may be a quadrangular shape or an elliptic shape, etc.

In the probe guide plate 1 according to the embodiment, the silicon oxide layer 12 on the upper portions of the inner wall surfaces of the through holes TH of the silicon substrate 10 is partially protected by the protective insulating layer 20.

Therefore, when the probe guide plate 1 according to the embodiment is used as a probe guide plate 1 of a probe apparatus, probe terminals touch the protrusive portions P of the protective insulating layer 20 high in hardness, as will be described later.

In this manner, the silicon oxide layer 12 can be suppressed from being worn by the probe terminals, and the life of the probe guide plate 1 until the silicon oxide layer 12 is lost can be elongated. Accordingly, durability of the probe guide plate 1 can be improved.

Figure 8:
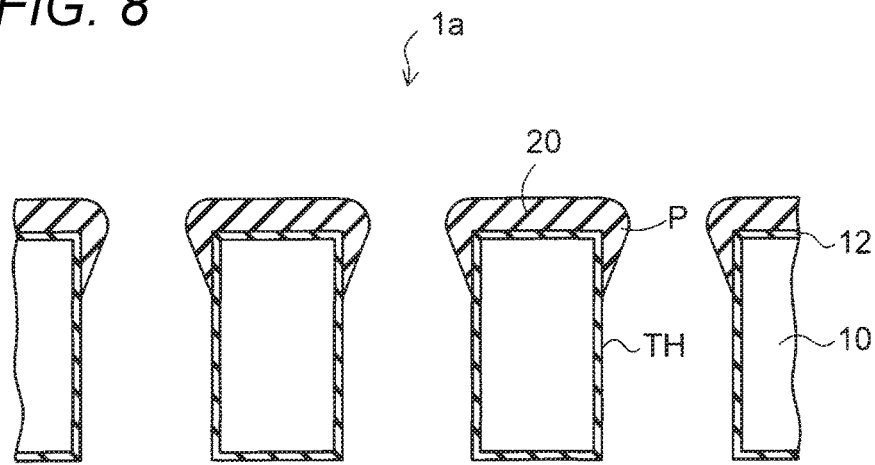
FIG. 8 is a sectional view showing a probe guide plate according to a first modification of the embodiment.

A probe guide plate 1a according to a first modification of the embodiment is shown in FIG. 8. In the aforementioned probe guide plate 1 in FIG. 5A, the thickness of the silicon oxide layer 12 is, for example, about 5 μm.

On the other hand, the thickness of a silicon oxide layer 12 of the probe guide plate 1a is set to be considerably thin in a range of about 0.5 μm to 1 μm in the first modification in FIG. 8. In FIG. 8, other elements than the thickness of the silicon oxide layer 12 are the same as those in the probe guide plate 1 in FIG. 5A.

A silicon substrate 10 is thermally oxidized to form the silicon oxide layer 12. Accordingly, when the thickness of the silicon oxide layer 12 increases, a processing time increases to thereby cause an increase in cost. Therefore, if the thickness of the silicon oxide layer 12 is set to be thin, the throughput can be improved and the cost can be reduced.

In the case where there is such a request, the thickness of the silicon oxide layer 12 is set to be thinner than the thickness of each protrusive portion P of a protective insulating layer 20 so that the silicon oxide layer 12 is protected, as shown in FIG. 8. For example, the thickness of the silicon oxide layer 12 is set at about 0.5 μm, and the thickness of the protrusive portion P of the protective insulating layer 20 is set at about 5 μm.

Thus, the silicon oxide layer 12 is protected by the protective insulating layer 20 in the embodiment. Therefore, the thickness of the silicon oxide layer 12 can be set to be thinner than that in the background art. Since the silicon oxide layer 12 which is thin in film thickness is protected by the protective insulating layer 20, the probe guide plate having satisfactory durability can be manufactured with high production efficiency and at low cost.

Figure 9:
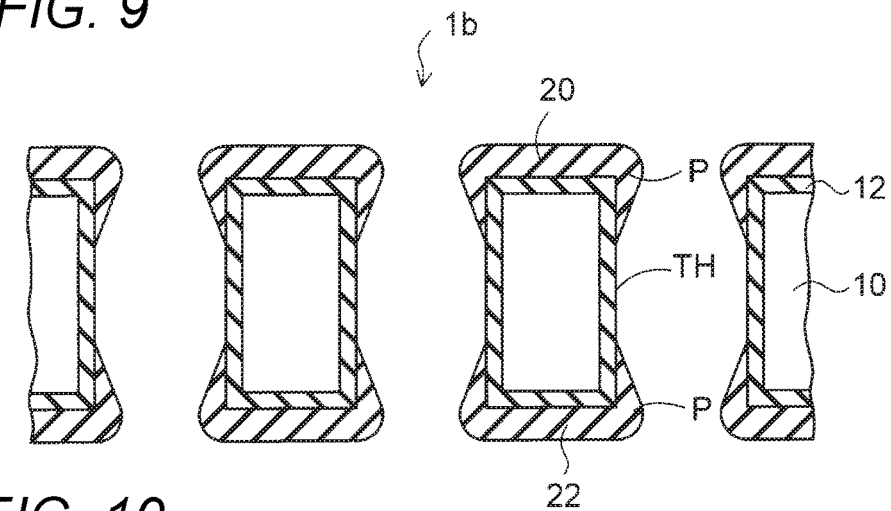
FIG. 9 is a sectional view showing a probe guide plate according to a second modification of the embodiment.

A probe guide plate 1b according to a second modification of the embodiment is shown in FIG. 9. As in the second modification in FIG. 9, a lower-side protective insulating layer 22 may be likewise formed via the silicon oxide layer 12 in a range of from the lower surface of the silicon substrate 10 to lower portion sides of inner wall surfaces of through holes TH.

Also, in the protective insulating layer 22 formed on the lower surface side of the silicon substrate 10, portions of the protective insulating layer 22 disposed on the lower portion sides of the inner wall surfaces of the through holes TH are likewise formed as protrusive portions P protruding outward inside the through holes TH.

Likewise, the protective insulating layer 22 is formed to be gradually thinner from the lower side of the inner wall surface of each through hole TH toward an upper side position of the same.

Except that the lower-side protective insulating layer 22 is formed additionally, the structure in FIG. 9 is the same as that of the aforementioned probe guide plate 1 in FIG. 5A.

The probe guide plate 1b according to the second modification in FIG. 9 may be manufactured as follows. That is, a protective insulating layer 20 is formed on an upper surface of the aforementioned silicon substrate 10 in FIG. 4B by a sputtering method. Then, the lower surface of the silicon substrate 10 is made to face up and the protective insulating layer 22 is likewise formed thereon by the sputtering method.

In the probe guide plate 1b according to the second modification in FIG. 9, the protective insulating layers 20 and 22 on the upper surface side and the lower surface side of the silicon substrate 10 are formed up to a midway position of the inner wall surface of each through hole TH in the depth direction. A region in a depthwise central portion of the inner wall surface of the through hole TH is a non-formation region where the protective insulating layers 20 and 22 are not formed.

When the protective insulating layers 20 and 22 on the upper surface side and the lower surface side of the silicon substrate 10 are formed in the same sputtering conditions, the upper-side and lower-side protective insulating layers 20 and 22 are formed symmetrically with respect to the center of the thickness of the silicon substrate 10.

In the probe guide plate 1b according to the second modification, the protective insulating layer 20 is formed on the upper portion sides of the inner wall surfaces of the through holes TH of the silicon substrate 10, and the protective insulating layer 22 is formed on the lower portion sides of the inner wall surfaces of the through holes TH. Therefore, even when the probe terminals are inclined to be inserted into the through holes TH, the silicon oxide layer 12 on the lower portions of the inner wall surfaces of the through holes TH can be suppressed from being worn so that the life of the probe guide plate can be improved.

Figure 10:
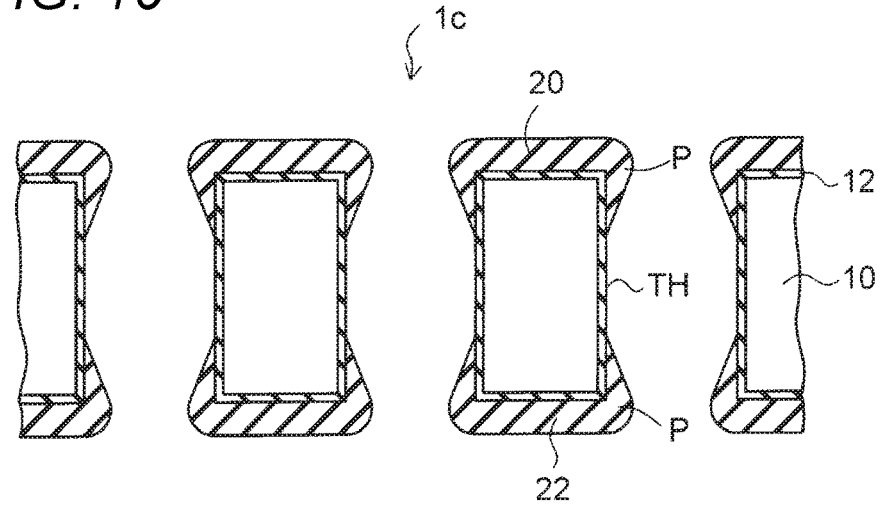
FIG. 10 is a sectional view showing a probe guide plate according to a third modification of the embodiment.

In addition, a probe guide plate 1c according to a third modification of the embodiment is shown in FIG. 10. In the third modification in FIG. 10, the thickness of a silicon oxide film 12 is set to be thin in the aforementioned probe guide plate 1b in FIG. 9. In FIG. 10, other elements than the thickness of the silicon oxide layer 12 are the same as those in the probe guide plate 1b in FIG. 9.

In the probe guide plate 1c according to the third modification, the thickness of the silicon oxide layer 12 is reduced, and protective insulating layers 20 and 22 are formed respectively on upper portion sides and lower portion sides of inner wall surfaces of through holes TH. In this manner, similarly to the aforementioned probe guide plate 1a according to the first modification in FIG. 8, the thickness of the silicon oxide layer 12 can be reduced so that cost can be reduced.

Further, even when probe terminals are inclined to be inserted into the through holes TH, the silicon oxide layer 12 on the lower portion sides of the inner wall surfaces of the through holes TH can be suppressed from being worn, similarly to the aforementioned probe guide plate 1b according to the second modification in FIG. 9.

A probe apparatus 2 provided with the probe guide plate 1 according to the embodiment is shown in FIG. 11. As shown in FIG. 11, the aforementioned probe guide plate 1 in FIG. 5A is disposed under an intermediate substrate 30 in the probe apparatus 2 according to the embodiment. The intermediate substrate 30 and the probe guide plate 1 are fixed by a holder 40 disposed around the intermediate substrate 30 and the probe guide plate 1.

The intermediate substrate 30 is provided with a substrate body 32, probe terminals 34, and electrodes 36. The substrate body 32 is formed out of ceramics, silicon, glass, or a resin etc. The probe terminals 34 are provided to penetrate the substrate body 32 in a thickness direction. The probe terminals 34 are formed out of nickel, copper, gold or rhodium etc.

One end sides of the probe terminals 34 are inserted into through holes TH of the probe guide plate 1. The other end sides of the probe terminals 34 are connected to the electrodes 36 on the substrate body 32. The one end sides of the probe terminals 34 protrude downward from the lower side of the probe guide plate 1.

Terminals of an inspecting apparatus (not shown) such as a measuring instrument are electrically connected to the electrodes 36 of the intermediate substrate 30 of the probe apparatus 2. Various test signals are supplied from the inspecting apparatus to a subject through the intermediate substrate 30 of the probe apparatus 2. In this manner, electric properties of the subject can be measured.

A semiconductor device 50 as an example of the subject is disposed under the probe apparatus 2. Electrode pads 52 are provided to be exposed in a front face of the semiconductor device 50.

The probe terminals 34 of the probe apparatus 2 are disposed correspondingly to the electrode pads 52 of the semiconductor device 50 respectively.

The semiconductor device 50 is disposed on a stage (not shown) which can be aligned with the probe apparatus 2 so that the probe terminals 34 of the probe apparatus 2 and the electrode pads 52 of the semiconductor device 50 can be aligned with each other respectively.

The probe apparatus 2 is connected to a moving unit (not shown) so that the probe apparatus 2 can move in an up/down direction. When the probe apparatus 2 moves down, front ends of the probe terminals 34 of the probe apparatus 2 contact the electrode pads 52 of the semiconductor device 50 with predetermined pressure. On this occasion, the probe terminals 34 are bend so that the inner wall surfaces of the through holes TH of the probe guide plate 1 are scratched by the probe terminals 34.

Alternatively, when the probe terminals 34 are connected to a spring mechanism etc. inside the intermediate substrate 30, the probe terminals 34 move up/down inside the through holes TH of the probe guide plate 1 so that the inner wall surfaces of the through holes TH are scratched by the probe terminals 34.

A state in which the probe terminals 34 of the probe apparatus 2 have contacted the electrode pads 52 of the semiconductor device 50 to measure electric properties is shown in FIG. 11.

When the measurement of the electric properties of the semiconductor device 50 is completed, the probe apparatus 2 moves up, and a next semiconductor device 50 is placed on the stage. Then, electric measurement is repeatedly performed.

In the probe guide plate 1 according to the embodiment, the protective insulating layer 20 is partially formed in a range of from the upper surface side of the silicon substrate 10 to the upper portion sides of the inner wall surfaces of the through holes TH. The protrusive portions P of the protective insulating layer 20 are disposed on the upper portions of the inner wall surfaces of the through holes TH.

As described above, after the silicon oxide layer 12 is formed in the opposite surfaces of the silicon substrate 10 and the inner wall surfaces of the through holes TH by thermal oxidation, the protective insulating layer 20 is formed by the sputtering method.

For this reason, the protective insulating layer 20 can be formed out of an insulating material such as a zirconia layer higher in hardness than the silicon oxide layer 12. Accordingly, the protective insulating layer 20 has a strong structure against wear by the probe terminals 34.

Thus, the life of the probe guide plate 1 until the silicon oxide layer 12 is lost from the inner wall surfaces of the through holes TH can be elongated. Accordingly, durability of the probe guide plate 1 can be improved.

In addition, even when wall parts of the probe guide plate 1 disposed around the probe terminals 34 are narrowed in accordance with shortening of the pitch for disposing the electrode pads 52 of the semiconductor device 50, the upper portions of the narrowed wall parts can be reinforced by the protective insulating layer 20. Therefore, even when the pitch for disposing the through holes TH of the probe guide plate 1 is shortened, necessary mechanical strength can be retained.

In addition, the probe terminals 34 mainly contact the protrusive portions P of the protective insulating layer 20 inside the through holes TH of the probe guide plate 1. Accordingly, stable sliding property of the probe terminals 34 can be maintained so that dislocation of contact portions of the probe terminals can be prevented.

In addition, the protective insulating layer 20 is only formed as a thin film on the silicon substrate 10 and parts of the inner wall surfaces of the through holes TH by the sputtering method. Therefore, the coefficient of thermal expansion of the probe guide plate 1 made of silicon as a whole substantially does not change, so that mismatching in the coefficient of thermal expansion between the probe guide plate 1 and the semiconductor device 50 made of silicon does not occur.

Thus, even when the semiconductor device 50 is heated at about 300° C. for measuring electric properties of the semiconductor device 50, high position accuracy of the probe terminals 34 can be maintained so that high reliability during electric measurement can be obtained.

As described above, the exemplary embodiment and the modification are described in detail. However, the present invention is not limited to the above-described embodiment and the modification, and various modifications and replacements are applied to the above-described embodiment and the modifications without departing from the scope of claims.

Various aspects of the subject matter described herein are set out non-exhaustively in the following numbered clauses:

1) A method of manufacturing a probe guide plate, the method comprising:
a) forming a through hole through a silicon substrate to extend from one surface of the silicon surface to the other surface of the silicon substrate;
b) forming a silicon oxide layer on the one surface of the silicon substrate, the other surface of the silicon substrate, and an inner wall surface of the through hole; and
c) forming a protective insulating layer on the silicon oxide layer,
wherein in step (c), the protective insulating layer is formed on at least one of the one surface and the other surface of the silicon substrate via the silicon oxide layer, and partially formed on the inner wall surface of the through hole via the silicon oxide layer.

2) The method of clause (1), wherein, in step (c), the protective insulating layer is formed on the silicon oxide layer by a sputtering method.

3) The method of clause (1), wherein in step (c), a portion of the protective insulating layer partially formed on the inner wall surface of the through hole via the silicon oxide layer is configured as a protrusive portion protruding from the inner wall surface.

4) The method of clause (1), wherein the protective insulating layer is formed on the one surface or the other surface of the silicon substrate via the silicon oxide layer, and
wherein the protective insulating layer formed on the one surface or the other surface of the silicon substrate via the silicon oxide layer is integrally formed with the protective insulating layer partially formed on the inner wall surface of the through hole via the silicon oxide layer.

5) The method of clause (1), wherein the protective insulating layer is formed on the one surface and the other surface of the silicon substrate via the silicon oxide layer,
wherein the protective insulating layer formed on the one surface of the silicon substrate via the silicon oxide layer is integrally formed with the protective insulating layer partially formed on the inner wall surface of the through hole via the silicon oxide layer, and
wherein the protective insulating layer formed on the other surface of the silicon substrate via the silicon oxide layer is integrally formed with the protective insulating layer partially formed on the inner wall surface of the through hole via the silicon oxide layer.

6) The method of clause (1), wherein the protective insulating layer is one of a zirconia layer, an alumina layer and a silicon oxide layer.

What is claimed is:
1. A probe guide plate comprising:
a silicon substrate comprising one surface and the other surface opposite to the one surface;
a through hole formed through the silicon substrate to extend from the one surface of the silicon substrate to the other surface of the silicon substrate;
a silicon oxide layer formed on the one surface of the silicon substrate, the other surface of the silicon substrate, and an inner wall surface of the through hole; and
a protective insulating layer formed on the silicon oxide layer, wherein the protective insulating layer is formed on at least one of the one surface and the other surface of the silicon substrate via the silicon oxide layer, and partially formed on the inner wall surface of the through hole via the silicon oxide layer, wherein the protective insulating layer formed on at least one of the one surface and the other surface of the silicon substrate via the silicon oxide layer is integrally formed with the protective insulating layer partially formed on the inner wall surface of the through hole via the silicon oxide layer, and wherein a thickness of the protective insulating layer partially formed on the inner wall surface of the through hole via the silicon oxide layer is gradually reduced toward a center portion of the silicon substrate in a thickness direction of the silicon substrate.

2. The probe guide plate of claim 1, wherein a portion of the protective insulating layer partially formed on the inner wall surface of the through hole via the silicon oxide layer is configured as a protrusive portion protruding from the inner wall surface.

3. The probe guide plate of claim 1, wherein the protective insulating layer is formed on the one surface or the other surface of the silicon substrate via the silicon oxide layer, and wherein the protective insulating layer formed on the one surface or the other surface of the silicon substrate via the silicon oxide layer is integrally formed with the protective insulating layer partially formed on the inner wall surface of the through hole via the silicon oxide layer.

4. The probe guide plate of claim 1, wherein the protective insulating layer is one of a zirconia layer, an alumina layer and a silicon oxide layer.

5. The probe guide plate of claim 1, wherein the inner wall surface of the through hole has a first region where the protective insulating layer is formed via the silicon oxide layer and a second region where the protective insulating layer is not formed via the silicon oxide layer.

6. A probe guide plate comprising:
a silicon substrate comprising one surface and the other surface opposite to the one surface;
a through hole formed through the silicon substrate to extend from the one surface of the silicon substrate to the other surface of the silicon substrate;
a silicon oxide layer formed on the one surface of the silicon substrate, the other surface of the silicon substrate, and an inner wall surface of the through hole; and
a protective insulating layer formed on the silicon oxide layer,
wherein the protective insulating layer is formed on at least one of the one surface and the other surface of the silicon substrate via the silicon oxide layer, and partially formed on the inner wall surface of the through hole via the silicon oxide layer,
wherein the protective insulating layer formed on at least one of the one surface and the other surface of the silicon substrate via the silicon oxide layer is integrally formed with the protective insulating layer partially formed on the inner wall surface of the through hole via the silicon oxide layer, wherein the protective insulating layer is formed on the one surface and the other surface of the silicon substrate via the silicon oxide layer, wherein the protective insulating layer formed on the one surface of the silicon substrate via the silicon oxide layer is integrally formed with the protective insulating layer formed on a first portion of the inner wall surface of the through hole via the silicon oxide layer, wherein the protective insulating layer formed on the other surface of the silicon substrate via the silicon oxide layer is integrally formed with the protective insulating layer formed on a second portion of the inner wall surface of the through hole via the silicon oxide layer, and wherein the protective insulating layer formed on the first portion of the inner wall surface of the through hole via the silicon oxide layer is separated from the protective insulating layer formed on the second portion of the inner wall surface of the through hole via the silicon oxide layer.

7. The probe guide plate of claim 6, wherein
a thickness of the protective insulating layer formed on the first portion of the inner wall surface of the through hole via the silicon oxide layer is gradually reduced toward a center portion of the silicon substrate in a thickness direction of the silicon substrate, and a thickness of the protective insulating layer formed on the second portion of the inner wall surface of the through hole via the silicon oxide layer is gradually reduced toward the center portion of the silicon substrate in the thickness direction of the silicon substrate.

8. The probe guide plate of claim 6, wherein the inner wall surface of the through hole has a first region where the protective insulating layer is formed via the silicon oxide layer and a second region where the protective insulating layer is not formed via the silicon oxide layer.

9. A probe apparatus comprising:
a probe guide plate comprising:
a silicon substrate comprising one surface and the other surface opposite to the one surface;
a through hole formed through the silicon substrate to extend from the one surface of the silicon substrate to the other surface of the silicon substrate;
a silicon oxide layer formed on the one surface of the silicon substrate, the other surface of the silicon substrate, and an inner wall surface of the through hole; and
a protective insulating layer formed on the silicon oxide layer,
a probe terminal configured to be inserted in the through hole of the probe guide plate,
wherein the protective insulating layer is formed on at least one of the one surface and the other surface of the silicon substrate via the silicon oxide layer, and partially formed on the inner wall surface of the through hole via the silicon oxide layer, and
wherein a thickness of the protective insulating layer partially formed on the inner wall surface of the through hole via the silicon oxide layer is gradually reduced toward a center portion of the silicon substrate in a thickness direction of the silicon substrate.

* * * * *